US006922798B2

(12) United States Patent
Nemani et al.

(10) Patent No.: US 6,922,798 B2
(45) Date of Patent: Jul. 26, 2005

(54) APPARATUS AND METHODS FOR PROVIDING ENHANCED REDUNDANCY FOR AN ON-DIE CACHE

(75) Inventors: Mahadevamurty Nemani, Sunnyvale, CA (US); Kenneth R. Smits, San Ramon, CA (US)

(73) Assignee: Intel Corporation, Santa Clara, CA (US)

( * ) Notice: Subject to any disclaimer, the term of this patent is extended or adjusted under 35 U.S.C. 154(b) by 559 days.

(21) Appl. No.: 10/210,342

(22) Filed: Jul. 31, 2002

(65) Prior Publication Data

US 2004/0025095 A1 Feb. 5, 2004

(51) Int. Cl.$^7$ .............................................. G11C 31/28
(52) U.S. Cl. ...................................... 714/710; 714/711
(58) Field of Search .............................. 711/129, 118; 365/200; 379/88.1; 714/733, 710, 711

(56) References Cited

U.S. PATENT DOCUMENTS

| | | | | |
|---|---|---|---|---|
| 5,752,260 A | * | 5/1998 | Liu | 711/129 |
| 5,818,785 A | | 10/1998 | Ohshima | 365/230.03 |
| 5,883,814 A | | 3/1999 | Luk et al. | 364/491 |
| 5,920,515 A | * | 7/1999 | Shaik et al. | 365/200 |
| 6,023,746 A | * | 2/2000 | Arimilli et al. | 711/118 |
| 6,115,795 A | | 9/2000 | Gilda et al. | 711/141 |
| 6,535,584 B1 | * | 3/2003 | Reinders | 379/88.1 |
| 6,769,081 B1 | * | 7/2004 | Parulkar | 714/733 |
| 2003/0005222 A1 | | 1/2003 | Smits et al. | 711/118 |
| 2003/0005224 A1 | | 1/2003 | Smits et al. | 711/118 |
| 2003/0005225 A1 | | 1/2003 | Smits | 711/119 |
| 2003/0084389 A1 | | 5/2003 | Kottapalli et al. | 714/733 |

OTHER PUBLICATIONS

G. Northrop et al. "600MHz G5 S/390 Microprocessor." ISSCC 1999, pp. 88–89, 449.

* cited by examiner

Primary Examiner—David Ton
(74) Attorney, Agent, or Firm—Hanley, Flight & Zimmerman, LLC

(57) ABSTRACT

Apparatus and methods for providing enhanced redundancy for a cache are provided. For example, an on-die cache is disclosed which includes a first memory array having a defective array line; a second memory array having a defective array line; and a redundant memory array having a plurality of array lines. A first one of the array lines is mapped to the defective array line of the first array and a second one of the array lines is mapped to the defective array line of the second array.

59 Claims, 8 Drawing Sheets

APPARATUS AND METHODS FOR PROVIDING ENHANCED REDUNDANCY FOR AN ON-DIE CACHE

FIELD OF THE INVENTION

The invention relates generally to microprocessors, and, more particularly, to apparatus and methods for providing enhanced redundancy for an on-die cache.

BACKGROUND OF THE INVENTION

Microprocessors with one or more large on-die cache memories are known. Such cache memory is used to expedite operation of the system by reducing the number of fetches from main memory. (Such fetches have large latencies because main memory is located off the chip.) Cache memory is arranged in arrays, with each array having a number of array lines. A cache line is an addressable line of memory written across a bank of arrays. For example, a bank of thirty-two arrays each having an array line size of 4 bytes, could be used to form a set of 128 byte cache lines. For an array size of 32 KB, the set of arrays would provide 8196 cache lines of 128 bytes.

Typically, such cache memories include a data array, a cache directory, and cache management logic. The cache directory usually includes a tag array, tag status bits, and least recently used (LRU) bits. (Each directory entry is called a "tag.") The tag directory contains the main memory addresses of code and data stored in the data cache plus additional status bits used by the cache management logic.

While the presence of these large on-die caches has improved system performance, integrating such large caches in an acceptable die area has required a drastic reduction in memory cell size. This reduction in cell size, the lower voltages required by these small cells, and process variations during manufacturing have significantly impacted memory cell stability which translates directly into loss of production yield (i.e., it increases the number of rejected chips in the manufacturing process).

As used herein, a hard error is an error that is always present, usually due to a defect in the physical structure of a memory cell. A soft error is an error that only occurs once during an access to memory. Subsequent accesses to that memory location do not usually repeat. Instead, such subsequent accesses result in normal operation.

Error correction coding (ECC) techniques are known which can identify and fix some hard errors to thereby improve the production yields. However, using ECC techniques and the available ECC bits to correct hard errors, reduces the number of soft errors (e.g., particle induced changes in bits) that can be corrected with the practically available ECC techniques and, thus, results in an increased soft error rate (SER).

To address this issue, hardware redundancy is currently being used. In this technique, one extra redundant array is provided for each set of memory arrays defining a set of cache lines. (For example, in the 32 array illustration given above, one extra array is provided for each bank of 32 arrays.) Due to the presence of this redundant array, if an array in the associated bank of arrays is defective due to a failure of one or more bits in the array, the defective array is replaced with the redundant array on a one array for one array basis.

If the number of defective arrays exceeds the number of associated redundant arrays (e.g., if more than one array in a bank is defective), the chip is non-functional and must be discarded. If there is a large bit failure rate, to compensate for lost arrays, a large degree of redundancy is required. However, increasing the number of redundant arrays, increases the die size and is, thus, not desirable.

Very large on-die caches also present further difficulties in the implementation of redundant storage elements. In traditional cache designs with redundancy, the redundant array is read at the same time that all the other arrays are read. The selection of which bits are output from the cache is typically controlled through multiplexing. When an array fails, fuses on the chip are usually blown in order to switch the defective array out and replace them with the redundant array. The drawback of this approach is that, if the cache has very large outputs, the multiplexing problem is huge. For example, if the cache outputs 256 bits, then the redundant array has to have multiplexing connections to be able to feed the data to any one of those 256 bits. Naturally, a huge overhead problem is created by such connections.

DESCRIPTION OF THE PREFERRED EXAMPLES

Figure 1:
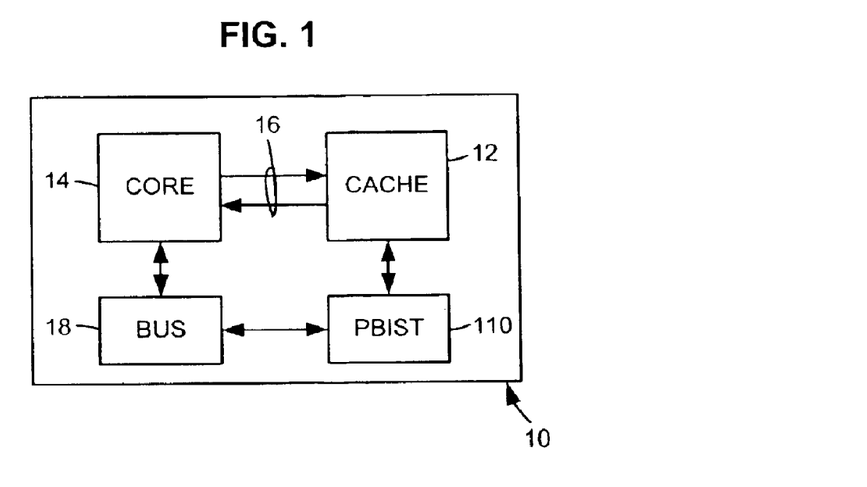
FIG. 1 is a schematic illustration of an example microprocessor constructed in accordance with the teachings of the instant invention.

FIG. 1 illustrates an exemplary self-healing microprocessor 10 constructed in accordance with the teachings of the invention. While the illustrated examples are discussed in the context of a microprocessor having an on-die cache 12, persons with ordinary skill in the art will readily appreciate that the disclosed teachings are not limited to on-die caches, but instead are applicable to any cache device which would benefit from the presence of the enhanced features described herein. Persons of ordinary skill in the art will further appreciate that the microprocessor 10 can be fabricated using conventional fabrication techniques.

As shown in FIG. 1, the illustrated microprocessor 10 includes a conventional core 14 and a cache 12 coupled to the core via a main bus 16. The core 14 contains, for example, a control unit and an arithmetic unit as are typically found in microprocessors such as those sold by Intel® (e.g., any of the Pentium® family, the Itanium™ family and/or the X Scale™ family of processors). The core 14 can access the cache 12 via the main bus 16 and access off-chip resources such as main memory (not shown) via an external bus 18, as is conventional.

Figure 2:
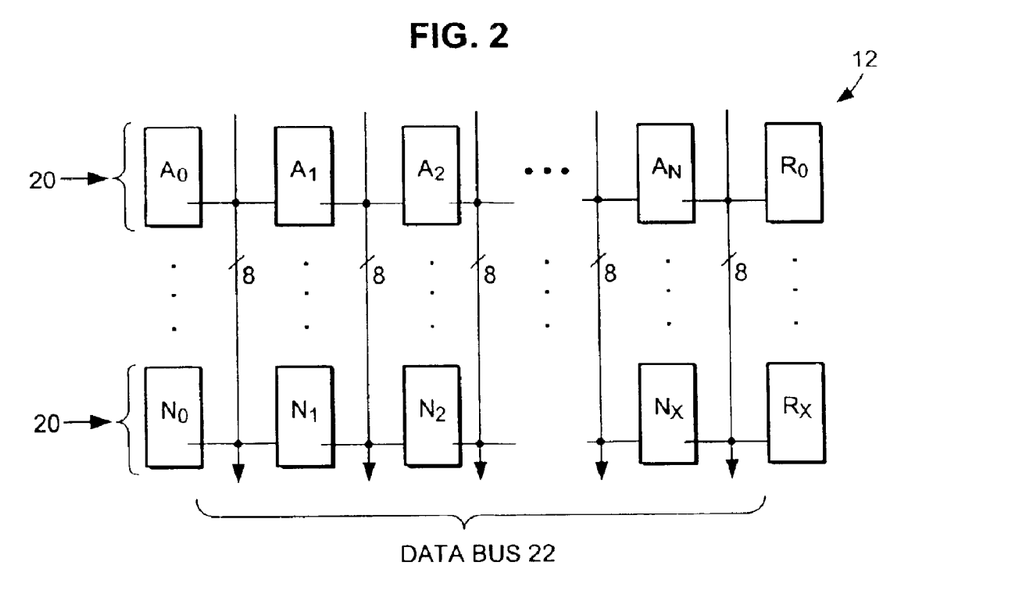
FIG. 2 is a schematic illustration of an example cache having multiple banks of memory arrays.

As shown in the example of FIG. 2, the cache 12 includes a plurality of memory arrays $A_0$–$R_N$. Although the memory arrays $A_0$–$R_N$ shown in FIG. 2 are arranged in a linear fashion, persons of ordinary skill in the art will appreciate that other configurations could likewise be employed. Similarly, although in the illustrated example, the arrays $A_0$–$R_N$ are each sized to store 32 KBs of data with each of 8196 array lines storing four bytes of data, persons of ordinary skill in the art will appreciate that other sizes and/or configurations are also possible. Additionally, although in the illustrated example, there are 32 memory arrays (e.g., $A_0$–$A_N$) and one redundant array (e.g., $R_0$) per bank of arrays 20, other numbers of arrays per cache line and/or other memory array(s) to redundancy array(s) ratios could likewise be employed. Furthermore, although the illustrated example includes multiple memory banks 20, any number of banks 20, including one bank 20, could alternatively be used.

As shown generally in FIG. 2, the cache 12 includes a dynamically programmable bus architecture 22 comprising a set of data buses. In the illustrated example, each of the data buses in the architecture 22 carries 8 lines of data in parallel, although persons of ordinary skill in the art will appreciate that other numbers of data buses and/or other data bus sizes could likewise be employed. Preferably, however, there is one less data bus in the bus architecture 22 then there are memory arrays (including redundant arrays R) in a bank (e.g., one less than "N+1," if "N" is the number of memory arrays ($A_0$–$A_N$) in a cache line and there is one redundant array per bank 22 as shown in FIG. 2).

Figure 3:
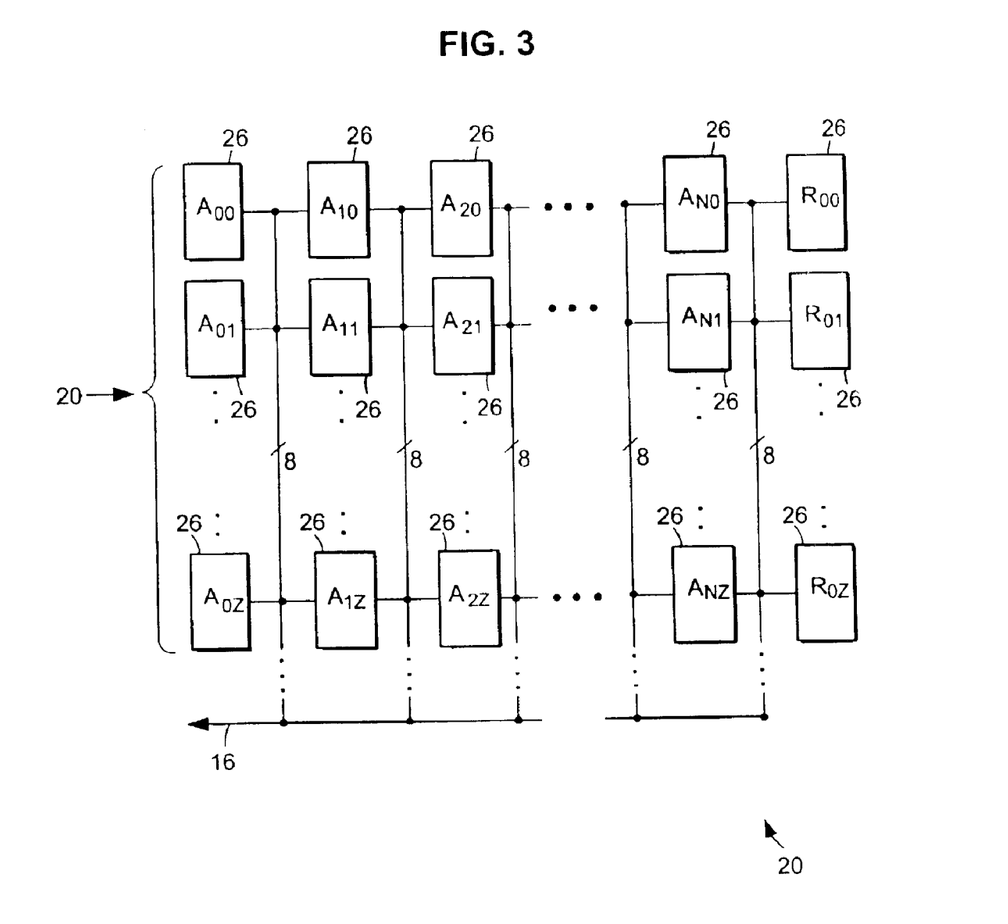
FIG. 3 is a schematic illustration of an example bank of the cache of FIG. 2 showing the individual array lines.

A more detailed view of the first bank 20 of arrays ($A_0$–$R_0$) is shown in FIG. 3. In the example of FIG. 3, each array ($A_0$–$R_0$) in the bank 20 has "Z" cache lines (e.g., 8196 cache lines). In the nomenclature used in FIG. 3, the first subscript of an array label (e.g., $A_{00}$) indicates the particular memory array (e.g., $A_0$, $A_1$, $R_0$, etc.) with which a particular array line 26 is associated. The second subscript indicates the particular cache line with which the array line 26 is associated (e.g., label $A_{00}$ indicates that the labeled line is in memory array "$A_0$" and cache line "0"). In the example of FIG. 3, with the exception of the array lines 26 of the first memory array $A_0$ and the redundant array $R_0$, each array line 26 is in selective communication with two buses of the bus architecture 22. The array line 26 of the first array $A_0$ and the array line 26 of the redundant array $R_0$ are connected to only one bus line. As shown in FIG. 3, each of the buses of the bus architecture 22 is in communication with the main bus 16 that returns data from the cache 12 to the core 14.

Figure 4:
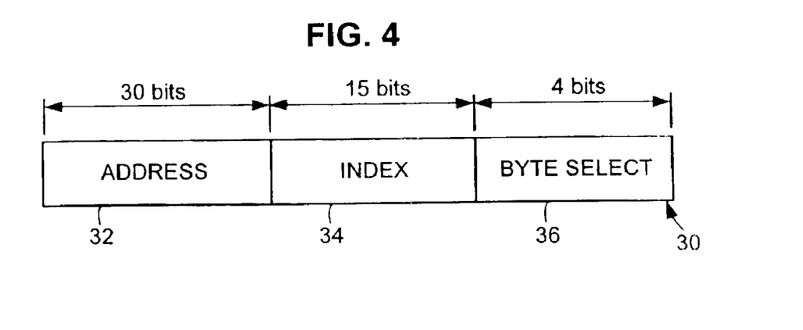
FIG. 4 illustrates an example read address structure.

When the core 14 requires data stored in the cache 12, it sends a read message 30 to the cache 12 via the bus 16. An example read message 30 is shown in FIG. 4. As illustrated, the example read message 30 includes an address portion 32, an index portion 34 and a byte select portion 36. The address portion 32 and index portion 34 together contain an address specifying the main memory address of the desired data. The byte select portion 36 stores data indicating the portion of the addressed cache line which contains data of interest.

Figure 5:
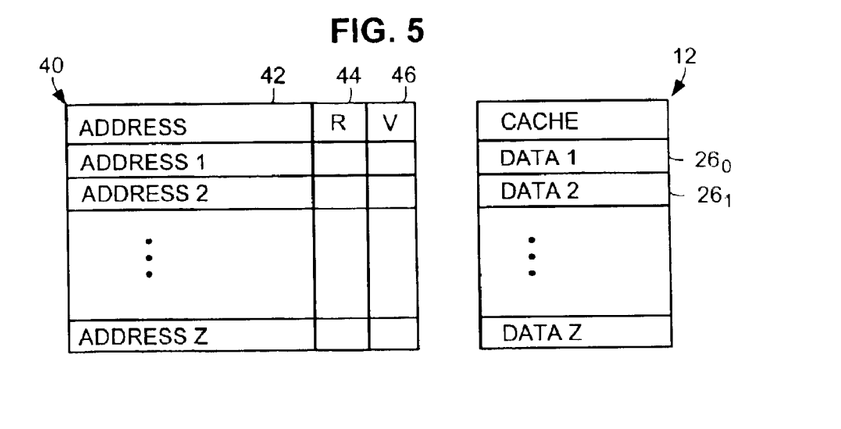
FIG. 5. illustrates an example tag directory in association with an example cache.

As stated above, the read message 30 is used to retrieve data from the cache 12. To this end, the cache 12 includes a tag directory 40 which selectively maps main memory addresses to cache lines. As shown in the example of FIG. 5, the tag directory 40 includes an address memory structure 42, a redundancy memory structure 44, and a validity memory structure 46. To reduce the size of the tag directory 40, only the data in the address portion 32 of a read message 30 is stored in the address memory structure 42 of the tag directory 40. However, the cache line $26_0$–$26_Z$ in which the address data is stored is selected by the data stored in the index portion 34 of the read message 30. In other words, the index (i.e., the data stored in the index field 34 of the read message 30) is used to identify the cache line of interest (e.g., $26_0$–$26_Z$).

A memory controller responds to the read message 30 by retrieving the address data from the address portion 42 of the line of the tag directory indicated by the index. The retrieved address data is then compared to the address data from the read message 30. If the address data in the address portion 32 of the read message 30 matches the address data in the address field 42 of the tag directory 40, the data from the corresponding line of the cache 12 is returned to the core 14 via the bus 16. Otherwise, the core 14 is advised that the requested data is not in the cache 12 and the core 14 subsequently requests the data from the main memory.

Persons of ordinary skill in the art will appreciate that the same index 34 can be associated with more than one address 32. To permit such circumstances without requiring read backs to the main memory, the cache 12 is divided into multiple segments (referred to as "Ways") and such Ways are accessed in parallel in response to a read message 30. Although the index will address multiple cache lines (each in a separate Way), since only one stored address 42 in the Ways of the tag directory 40 will match the data in the address portion 32 sent in the read message 30, only one of the cache lines will be read out as matching the data requested in the read message 30. Thus, the desired data will be retrieved from the cache 12 without requiring access to the main memory.

As the use of Ways is conventional, it will not be further discussed herein. Moreover, for simplicity of explanation, the following description will focus on only one Way, although it will be understood by persons of ordinary skill in the art that multiple Ways may be present. The presence of such additional Ways does not significantly change the principles of operation of the apparatus described in the following.

Figure 6:
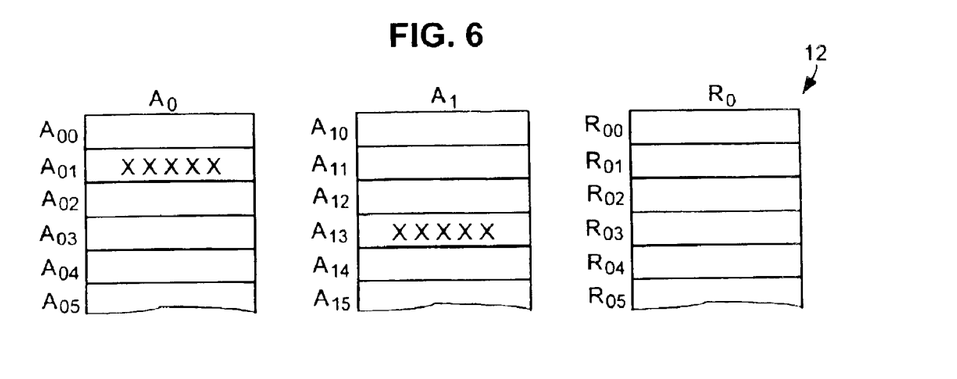
FIG. 6 schematically illustrates an example replacement of two array lines in different arrays using a single redundant array.

As stated above, the illustrated cache 12 includes a bank 20 of memory arrays (e.g., $A_0$–$A_N$) in association with a redundancy array (e.g., $R_0$). For purposes of illustration, a small portion of the cache 12 is shown in FIG. 6 and will be referred to in the following. During manufacture, it sometimes occurs that one or more bits in one or more memory arrays (e.g., $A_0$) fail. In the past, when failed bits occurred in two or more arrays of a given bank 20 having only one redundancy array (e.g., $R_0$), the cache 12 was defective and its associated chip had to be discarded because only one of the defective arrays could be replaced by the redundancy array.

To address this issue, the illustrated cache 12 assigns different lines of the redundancy array to different defective lines (which may optionally be in different arrays) of the cache 12 on an array line by array line basis so that formerly defective chips become operational. By way of a more concrete example, the cache 12 shown in FIG. 6 has a memory array $A_0$ with a defective array line $A_{01}$, and a second memory array $A_1$ with a defective array line $A_{13}$. However, the cache 12 also has a redundant array $R_0$ with a first redundant array line $R_{01}$ mapped to defective array line $A_{01}$, of the memory array $A_0$ and a second redundant array line $R_{03}$ mapped to the defective array line $A_{13}$ of the memory array $A_1$. Persons of ordinary skill in the art will appreciate that, whereas the cache 12 of FIG. 6 would have been defective and discarded in the prior art because the redundant array could only be used to replace one defective array (e.g., $A_0$ or $A_1$), in the illustrated example, the cache 12 is operational and saleable because the redundant array $R_0$ is selectively used to replace defective portions (e.g., array lines) of both of the arrays $A_0$, $A_1$. Because in the illustrated example, only one redundant array $R_0$ is provided for each bank 20 of memory arrays, defective array lines (e.g., $A_{01}$, $A_{13}$) must be in separate cache lines to permit replacement. In this example, if two defective array lines appear in the same cache line (e.g., array lines $A_{01}$, $A_{11}$), the cache 12 is defective.

For the purpose of mapping portions (e.g., lines) of the redundancy array (e.g., $R_0$) to defective portions (e.g., lines) of the memory arrays (e.g., $A_0$, $A_1$), the tag directory 40 is structured to include the redundancy memory structure 44. (See FIG. 5). The redundancy data structure 44 is sized to store redundancy data which is used, for example, to map a corresponding array line (e.g., $R_{00}$) of the redundant array (e.g., $R_0$) to a defective array line (e.g., $A_{01}$) of a memory array (e.g., $A_0$). As also shown in FIG. 5, the tag directory 40 is also provided with the validity memory structure 46 to store validity data indicative of the validity of the data stored in a corresponding array line of the redundancy array. The preferred manner of decoding and using the redundancy data and the validity data is explained in detail below.

Figure 7:
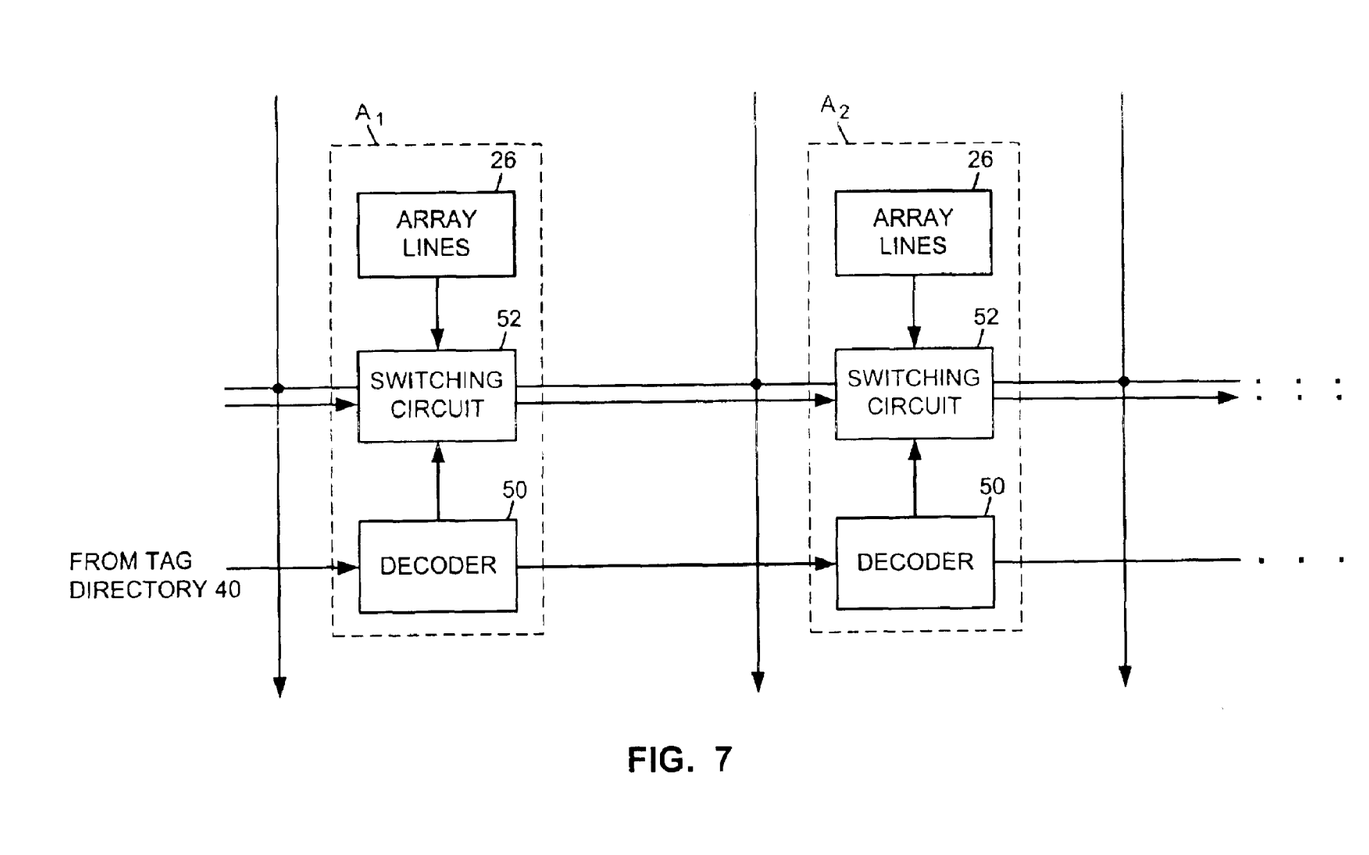
FIG. 7 is a schematic illustration of two example arrays.

For the purpose of decoding the redundancy data, each of the many arrays $A_0$–$N_x$ and $R_0$–$R_x$ includes a decoder 50. As shown in FIG. 7, the tag directory 40 is in communication with the decoders 50 such that, whenever a given cache line is accessed, the redundancy data stored in the redundancy field 44 of the tag directory 40 in association with that particular cache line will be read out and delivered to the decoders 50 associated with the memory arrays in that particular cache line (e.g., $A_0$–$A_n$). The decoders 50 will each decode the redundancy data and develop an output signal to dynamically program the bus architecture 22 as explained further below.

As mentioned above, with the exception of the first memory array $A_0$ and the redundant array $R_0$, each of the memory arrays $A_1$–$A_N$ is in selective communication with two of the buses in the bus architecture 22. To select which of the two possible buses a given array will communicate with, each array $A_1$–$A_N$ is provided with a switching circuit 52. As shown in FIG. 7, each switching circuit 52 is in communication with a decoder 50 and the array lines of the corresponding arrays $A_1$–$A_N$. Each switching circuit 52 of the arrays $A_1$–$A_N$ is responsive to an input signal from a switching circuit 52 in another array and an output signal from its respective decoder 50 to: (a) disconnect the corresponding array line 26 from both buses, (b) to connect the corresponding array line to the bus on the left side of the array, and/or (c) to connect the corresponding array line to the bus on the right side of the array. Thus, the configuration of the switching circuits 52 is driven by the outputs of the decoders 50 which are, in turn, driven by the validating and redundancy data read out of the tag directory 40. In other words, the switching circuit 52 and, therefore, the bus architecture 22, will have a configuration defined by the redundancy data stored for the particular cache line being read. Since the redundancy data can vary from cache line to cache line, the configuration of the bus architecture 22 can also vary from cache line to cache line. Thus, the bus architecture 22 is dynamically programmed based on which cache line is being read. This dynamic programmability enables one redundancy array (e.g., $R_0$) to replace defective array lines in different memory arrays (e.g., $A_0$–$A_N$) on an array line for array line basis without the need for complex multiplexing architectures.

Since, as discussed above, there is one less bus in the bus architecture 22 than there are memory arrays (e.g., $A_0$–$A_N$ and $R_0$) in a cache line, one memory array is effectively disconnected from the bus architecture 22 for every cache line. In other words, whenever a cache line is read, a subset of the memory arrays $A_0$–$A_N$, $R_0$ (e.g., one less than all of the arrays $A_0$–$A_N$ and $R_0$) will be connected to the main bus by the bus architecture 22. More specifically, viewing cache line "1" in the bank 20 of arrays $A_0$–$A_N$ and $R_0$ in FIG. 3, even if none of the array lines $A_{01}$–$A_N$ and $R_{01}$ are defective, one of the array lines (e.g., $R_{01}$) will not be used because the presence of the redundant array line is not needed to store a full cache line of data (e.g., 128 bits). If, however, one of the array lines (e.g., $A_{11}$) is defective, then the redundancy data stored in the tag directory 40 for this particular cache line should be selected to configure the switching circuits 52 and bus architecture 22 to disconnect the defective array line (e.g., $A_{11}$) when the cache line is read. For example, if array line $A_{11}$ is defective, the redundancy data will cause the decoders 50 and switching circuits 52 to configure the bus architecture 22 so that array line $A_{01}$ is connected to the bus to its right in FIG. 3, the defective array line $A_{11}$ is disconnected from all buses, and the remaining array lines $A_{21}$–$A_{N1}$, $R_{01}$ are connected to the array lines to their left in FIG. 3. By way of another example, if array line $A_{21}$ is defective, redundancy data is stored in the tag directory 40 in association with the second cache line such that, when the second cache line is read, array line $A_{01}$ and $A_{11}$ communicate data to the main bus 16 via the buses to their right in FIG. 3, array line $A_{21}$ is not permitted to communicate data on any bus line, and array lines $A_{31}$–$A_{N1}$ and $R_{01}$ communicate data to the main bus 16 via the busses to their left in FIG. 3. In other words, different subsets of the memory arrays (e.g., $A_{01}$–$A_{N1}$, $R_{01}$) can be connected to the main bus 16 by the bus architecture 22 when different cache lines are read without changing the physical connections between the bus architecture 22 and the main bus 16. These subsets are chosen to switch out defective array lines when such are present, and to switch out the redundant array (e.g., $R_{01}$) when no defective array line is present in the cache line.

Since the data delivered to the main bus 16 from the cache line is expected in a predetermined order, persons of ordinary skill in the art will appreciate that data is written to the array lines (e.g., $A_{01}$–$R_{01}$) in the expected order (e.g., linearly from left to right) while skipping any defective array line. Thus, if used, the array line ($A_{00}$–$A_{0Z}$) in the first array $A_0$ will always store the first bits of the data stored on the cache line and, if used, the array lines ($R_{00}$–$R_{0Z}$) of the redundancy $R_0$ will always store the last bits of the cache line. In contrast, the array lines ($A_{10}$–$A_{1Z}$) of the second array $A_1$, if used could store either the first group of bits or the second group of bits in the cache line, depending on whether the array line ($A_{00}$–$A_{0Z}$) of the first array $A_0$ on that cache line is used or not.

As will be appreciated by persons of ordinary skill in the art, the decoders 50 are implemented by conventional logic circuits. In the illustrated example, each of the decoders 50 are unique in that, while all of the decoders 50 are fed the same input signal (i.e., the redundancy data) in response to a request to read a cache line, only one should output a signal indicating that its associated memory array should be disconnected from the bus architecture 22. For example, if there are 32 memory arrays $A_0$–$A_{32}$, and one redundant array $R_0$, then the redundancy data can comprise 5 bits (e.g., $2^5=32$) of data the validity data can comprise one bit of data, and each of the decoders 50 can be programmed in a conventional manner to output a high signal (e.g., a "1") only in response to a unique one of the six bit combinations possible in the redundancy and validity data. (Another way to look at the validity data is as simply part of the redundancy data, since the validity data is actually part of the address input to the decoder to identify which of the arrays ($A_0$–$A_{32}$, $R_0$) should be ignored. Of course, the validity data can be eliminated altogether (e.g., reduce the input to the decoder 52 from 6 bits to 5 bits) if one of the arrays ($A_0$–$A_{32}$, $R_0$) is eliminated from the chip so that only 32 arrays need to be addressed. Persons of ordinary skill in the art will appreciate that the combined total number of redundancy and validity bits should be enough to decode the total number of arrays ($A_0$–$A_X$) and one state that implies the redundancy array ($R_0$) is not being used. Thus, 5 bits can decode 31 arrays plus 1 redundancy array.

An example way to implement the switching circuits 52 will now be explained with reference to FIG. 8. Looking first at the special case of the first array $A_0$, that switching circuit includes ten NAND gates 60, 62, 68 and three inverters 63, 64, 65. The output of the decoder 50 is inverted by inverter 63 and then input to the NAND gates 60, 62. The other input of the NAND gates 60, 62 are tied to Vcc (i.e., a logic high input) so that the outputs of the NAND gates 60, 62 are solely dependent on the output of the decoder 50 (i.e., the NAND gates 60, 62 function as inverters).

In the illustrated example, the decoders 50 output a high logic signal (i.e., a "1") when the decoded redundant data indicates that the associated array line is to be ignored (e.g., isolated from the bus architecture 22). Assuming that the array line of the first array $A_0$ is defective for the cache line being read, the output of the decoder in array $A_0$ goes high. The inverter 63 inverts the output of the decoder 50 to a logic low signal. The output of the inverter 63 is inverted by the NAND gate 64 to a logic high signal which is, in turn, inverted by the inverter 64 such that the right shift signal $RS_0$ enters the low logic state.

Figure 8:
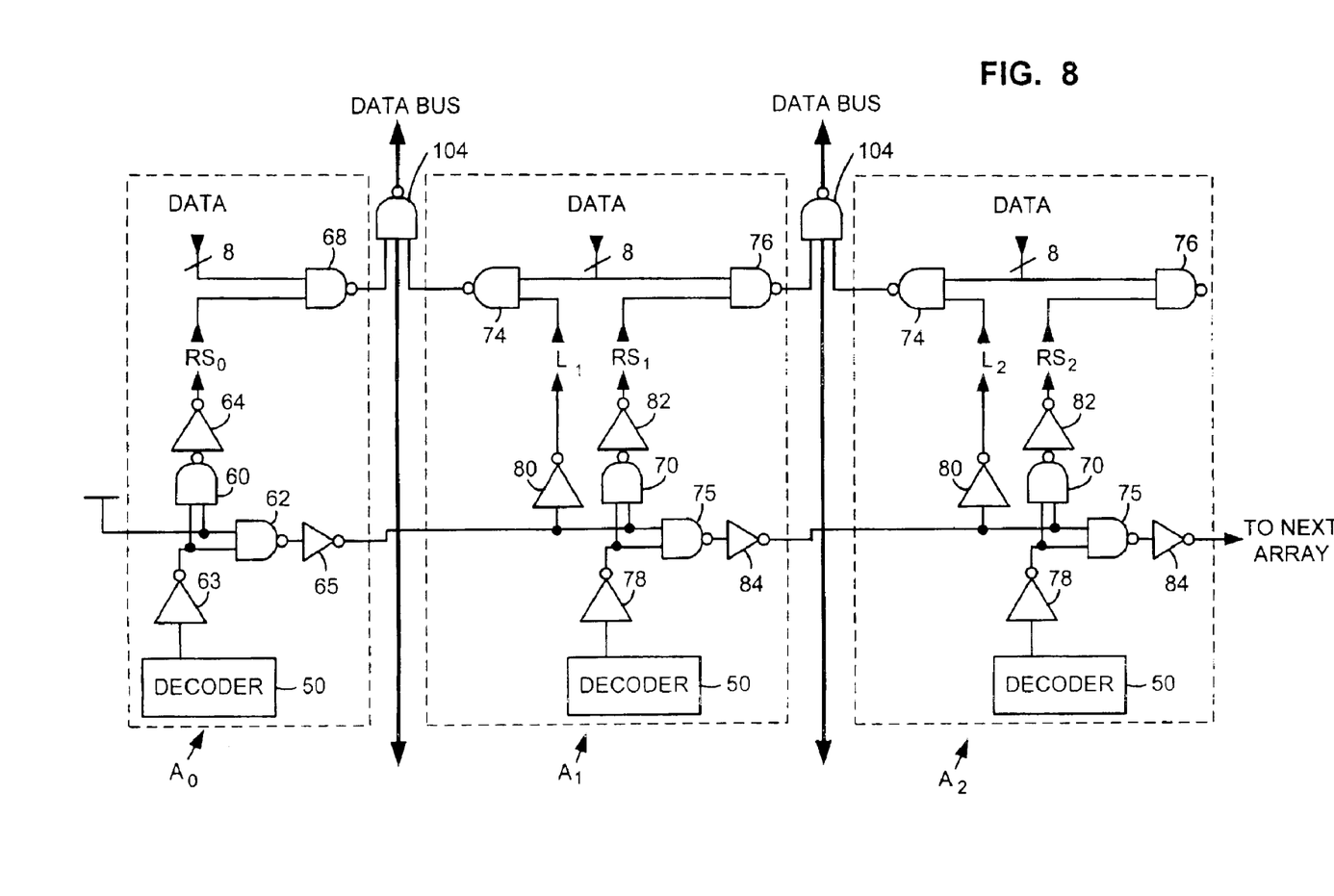
FIG. 8 is a more detailed illustration of portions of example arrays.

As shown in FIG. 8, the right shift signal $RS_0$ is an input to each of the eight NAND gates 68 (which form part of the switching circuit 52 of the first array $A_0$). The other input of each of the NAND gates is a data signal from the cache 12. The outputs of the NAND gates 68 are coupled to the data bus located between the first and second arrays $A_0$, $A_1$ (see FIG. 2). As will be appreciated by persons of ordinary skill in the art, a logic low input to a NAND gate always results in a logic high output of the NAND gate, thereby effectively blocking the other input of the NAND gate (i.e., turning the other input into a "don't care"). Therefore, since the right shift signal $RS_0$ is logic low when the decoder 50 in the first array $A_0$ indicates that the array line of that array $A_0$ is defective, the data from the cache 12 of array $A_0$ is logically blocked from the data bus by the NAND gates 68. In other words, the array line of the first array $A_0$ is logically disconnected from the bus architecture 22.

As shown in FIG. 8, because the output of the inverter 63 of the first array $A_0$ is logic low, the output of the second NAND gate 62 of the switching circuit 52 of the first array $A_0$ is logic high. This logic high output signal of the switching circuit 52 of the first array $A_0$ is inverted by the inverter 65 and then input to the switching circuit 52 of the second array $A_1$.

As stated above, the switching circuits 52 of all of the arrays $A_1$–$A_N$ except for the first array $A_0$ and the redundant array $R_0$ are identical. Therefore, the following description of the switching circuit 52 of the second array $A_1$ applies with equal force to the switching circuits of the arrays $A_1$–$A_N$.

As shown in FIG. 8, the switching circuit 52 of the second array $A_1$ includes eighteen NAND gates 70, 74, 75, 76, and four inverters 78, 80, 82, 84. The output of the switching circuit 52 of the first array $A_1$ is input to the NAND gates 70, 75, and to the inverter 80. The output of the switching circuit 52 of the first array $A_0$ is inverted by the inverter 80 to create a left shift signal $L_1$. As shown in FIG. 8, the left shift signal $L_1$ is input to a set of eight NAND gates 74 of the switching circuit 52. The other inputs of the NAND gates 74 are coupled to the data from the cache 12 of the second array $A_1$.

The output of the decoder 50 of the second array $A_1$ is inverted by the inverter 78 and then input to the NAND gate 70 and the NAND gate 75 as shown in FIG. 8. The output of the inverter 78 is NANDed with the output signal of the switching circuit 52 of the first array $A_0$ by the NAND gate 70. The output of the NAND gate 70 is inverted by the inverter 82 to produce a shift right signal $RS_1$. As shown in FIG. 8, the shift right signal $RS_1$ is input to a second set of eight NAND gates 76. As with the NAND gates 74, the other input of each of the eight NAND gates 76 is a data signal from the cache 12 of the second array $A_1$.

As shown FIG. 8, the outputs of the NAND gates 74 are coupled to the data bus located between the first and second arrays $A_0$, $A_1$ (see FIG. 2). The outputs of the NAND gates 76 of the array $A_1$ are coupled to the data bus located between the second and third arrays $A_1$, $A_2$ (see FIG. 2).

Returning to FIG. 8, the output of the NAND gate 75 is inverted by the inverter 84 to generate an output signal of the switching circuit 52 of the second array $A_1$. This output signal is input to the NAND gates 70, 75 and the inverter 80 of the switching circuit 52 of the third array $A_2$ in the same manner as the output signal of the switching circuit 52 of the first array $A_0$ is input to the corresponding structures of the second array $A_1$.

Returning to the example where the array line of the first array $A_0$ is defective, the output of the switching circuit 52 of the first array $A_0$ is a logic low. The logic low input signal is input to the NAND gate 70 whose output is, thus, logic high. The logic high output of the NAND gate 70 is inverted by the inverter 82 such that the shift right signal $RS_1$ becomes logic low. As shown in FIG. 8, when the shift right signal $RS_1$ becomes logic low, the eight NAND gates 76 always generate a logic high output. Thus, the data from the array line of the second array $A_1$ is logically isolated from the data bus to the right of the second array $A_1$ by the NAND gates 76.

Because, in this example, the array line in the first array $A_0$ is defective, the output signal from the switching circuit of the first array $A_0$ is logic low. This logic low signal is inverted by the inverter 80 to generate the shift left signal $L_1$ as logic high. As shown in FIG. 8, when the shift left signal $L_1$ is logic high, the NAND gates 74 communicate the data of the array line of the second memory array $A_1$ to the data bus between the first and second arrays (see FIG. 2). In other words, since in this example, the array line of the first array $A_0$ is defective, the bus architecture 22 is configured such that the array line of the second array $A_1$ is coupled to the left most bus and the first array is disconnected when the associated cache line is read.

As stated above, the output signal of the switching circuit of the first array $A_0$ is logic low. That logic low signal is input to the NAND gate 75 which generates a logic high output signal, which, in turn, is inverted to a logic low signal by the inverter 84. The output of the inverter 84, which is the output of the switching circuit 52 of the second array $A_1$, is, thus, logic low. This logic low signal is input to the switching circuit 52 of the third array $A_2$.

Figure 9:
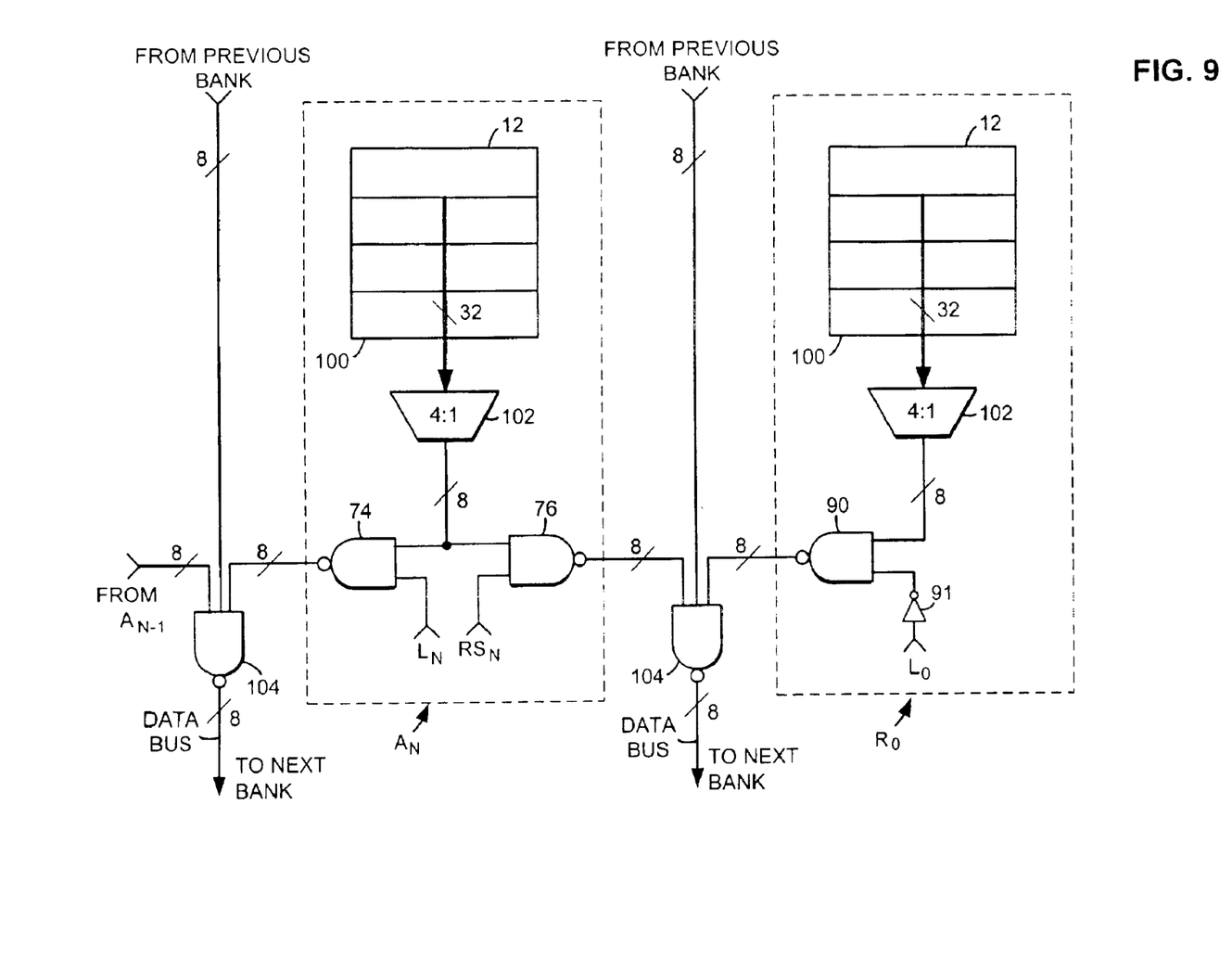
FIG. 9 is a schematic illustration of a portion of a memory array and a portion of a redundant array $R_0$.

Since the switching circuits 52 of the memory arrays $A_1$–$A_N$ are identical, the outputs of the switching circuits 52 of the arrays $A_1$–$A_N$ will also all be identical. As a result, in this example (i.e., the array line of memory array $A_0$ is defective) each of the arrays $A_1$–$A_N$ communicate the data from its requisite array line to the bus to its left. The redundant array $R_0$ operates similarly, but its switching circuit is structured differently as shown in FIG. 9.

As shown in that figure, the switching circuit 52 of the redundant array $R_0$ comprises eight NAND gates 90 and an inverter 91. The output of the switching circuit 52 of the memory array $A_N$ is logic low and is input to the inverter 91 as the shift left signal $L_0$. The output of the inverter 91 is then input to the NAND gates 90. The other input of each of the NAND gates is a respective data signal from the cache 12. Because, in this example, the shift left signal $L_0$ is logic high, the NAND gates propagate the data signals from the cache 12 to the data bus to the left of the redundant array $R_0$ (see FIG. 2).

For purposes of better understanding the operation of the illustrated device, another example will now be explained. In this example, for the cache line being read, the array line in the second array $A_1$ is assumed to be defective. As explained below, in these circumstances, (a) the arrays to the left of the defective array line (e.g., array $A_0$) output their data on the bus to their right, (b) the defective array line (e.g., array $A_1$) is logically isolated from the bus architecture 22, and (c) the arrays to the right of the defective array line (e.g., arrays $A_2$–$A_N$, $R_0$) output their data on the bus to their left.

Turning to FIG. 8, since the defective portion of the cache line signal in this example is assumed to be the array line of array $A_1$, the array line of the first array $A_0$ is operational. Accordingly, the output of the decoder 50 of the first array $A_0$ is logic low. As a result, the shift right signal $RS_0$ is also logic high and the NAND gates 68 are, thus, configured to transfer data from the cache 12 of the first array $A_0$ to the bus between the first and second arrays $A_0$, $A_1$ (see FIG. 2).

Because the output of the decoder 50 of the first array $A_0$ is logic low, the output of the NAND gate 62 of the switching circuit 52 is logic low and this logic low signal is inverted by the inverter 65. As a result, the input from the switching circuit 50 of the first array $A_0$ to the NAND gates 70, 75 and the inverter 80 of the second array $A_1$ is logic high. Consequently, regardless of the output of the decoder 50, the shift left signal $L_1$ of the second array $A_1$ is logic low thereby isolating the defective array line of the array $A_1$ from the bus to the left of the array $A_1$.

Since the input signal from the switching circuit 52 of the first array $A_0$ is logic low, the shift right signal $RS_1$ is also logic low. As a result, the defective array line ($A_1$) is also logically isolated from the bus to the right of the array $A_1$.

The input signal from the switching circuit 52 of the first array $A_0$ is logic high. Therefore, the output of the NAND gate 75 depends on the output of the decoder 50 of the secondary $A_1$. Since, in this example, the output of that decoder 50 is logic high, the output of the inverter 78 is logic low. As a result, the NAND gate 75 produces a logic high output which is inverted by the inverter 84 to produce a logic low output signal from the switching circuit 52 of the second array $A_1$. The switching circuit 52 of the third array $A_2$ responds to this input signal and the output of its associated decoder 50 (which is logic low), to generate a logic high left shift signal $L_2$, a logic low right shift signal $RS_2$ and a logic low switching circuit output signal. Thus, in this example, the first array $A_0$ delivers data to the bus between the first and second arrays $A_0$, $A_1$, the second array $A_1$ is isolated from the bus architecture, and all of the arrays $A_2$–$R_0$ to the right of the array $A_2$ deliver data to the bus on their left sides.

Of course, in most instances there will be no defective array line in the cache line being read. Under such circumstances, the shift right signals $RS_0$–$RS_N$ will all be logic high thereby causing each of the arrays $A_0$–$A_N$ to output cache data to the bus on its right side. In such circumstances, the output of the switching circuits 52 of the arrays $A_0$–$A_N$ will all be logic high. Since the output of the switching circuit of array $A_N$ is the shift-left signal of the redundant array $R_0$, the array line of the redundant array $R_0$ will be logically isolated by the NAND gates 90 from the bus architecture 22.

Before leaving the discussion of FIGS. 8–9, a few comments are in order. In particular, the example sub array busing of the cache architecture shown in those figures is repeated throughout the cache. In the example of FIGS. 8–9, five sub arrays ($A_0$, $A_1$, $A_2$, $A_N$, and $R_0$) of a common bank in the cache are depicted. For purposes of clarity, the word line decoder circuitry is omitted, and only one half of the data storage elements of each sub array are shown in the figure. For example, as shown in FIG. 9, data array 100 comprises half the storage capacity of the corresponding sub array, (e.g., $A_0$, $A_1$, $A_2$, $A_N$, and $R_0$). In the particular architecture shown in FIGS. 8–9, four 256-bit blocks of data are read out sequentially. In this example, 32 bits are taken down to 8 bits in each half portion of the sub array by multiplexers 102 associated with the sub arrays (see FIG. 9).

Further, to enhance the signal quality of the data delivered to the main bus 16, the buses of the bus architecture 22 illustrated in FIGS. 8–9 each includes a number of repeaters 104. Each of the repeaters 104 is implemented by a NAND gate 104 (in FIGS. 8 and 9, each NAND gate 104 represents 8 NAND gates) and has an input connected to the data bus line driven from a previous bank. Each of the repeaters 104 drives the data output on the line to the next cache bank. The other two inputs to each of the NAND gates 104 are connected to receive data from an adjacent sub array. For instance, the NAND gates 104 between the first and second arrays ($A_0$, $A_1$) has inputs coupled to receive data from both sub array $A_0$ and sub array $A_1$.

From the foregoing persons of ordinary skill in the art will appreciate that, by including dual sets of NAND gates (74,76) in the data output path of each sub array 104 (except the first array $A_0$ and the redundant array $R_0$), data can feed in two alternative directions toward two different bus lines. Each sub array also has its own left and right shift signals that determine which direction data is output. The left and right shift signals $L_N$, $RS_N$ can be used to switch individual sub arrays on or off the bus. In this way, a defective sub array can be omitted with just a change in the enable signaling—the data bus itself, is unchanged. This is achieved with no impact on power or speed. The large number of additional bus lines that characterized prior art cache designs with redundancy is, thus, obviated by the illustrated architecture.

It will also be appreciated by persons of ordinary skill in the art that, by reversing the left shift and right shift signals in the illustrated example, disconnecting a particular array will program the bus architecture in a contrary manner to that described above (i.e., every sub array to the left of the disconnected array in FIGS. 8–9 connects to the bus line to its right, and every sub array to the right of the disconnected array is shifted to the left). This change would require reversal of the first and redundant arrays $A_0$, $R_0$.

For the purpose of testing the cache 12 for defects in the memory arrays ($A_0$–$A_N$, $R_0$), and to develop and store the redundancy data which is used to dynamically program the bus architecture 22, the illustrated microprocessor 10 is further provided with a programmable built-in self-test (PBIST) module 110 (see FIG. 1). The PBIST 110 can be operated in the factory after or during fabrication of the microprocessor 10, at boot-up and/or periodically in the field (e.g., at times when the load on the microprocessor 10 is low). Thus, the redundancy data needed to program the bus architecture 22 of the cache 12 is preferably developed in the first instance in the factory by, for example, fabricating the microprocessor 10 and then activating the PBIST 110 to test the cache 12 for defects. Since it is possible for a chip to develop defects in the field that were not present (or not detected) at the factory, the redundancy data needed to program the bus architecture 22 may also be updated in the field from time to time by activating the PBIST 110. One possible way to update the redundancy data is to activate the PBIST 110 as part of the boot-up sequence of the microprocessor 10. Since the self test and reprogramming of the cache bus architecture 22 can be performed at any desired time, defective array lines can be replaced with the redundant array lines at any time, even in the field. Thus, the cache 12 and the microprocessor 10 are self-healing in that structural defects in the cache 12 are corrected as needed by swapping in a redundant array line for a defective array line.

Figure 10:
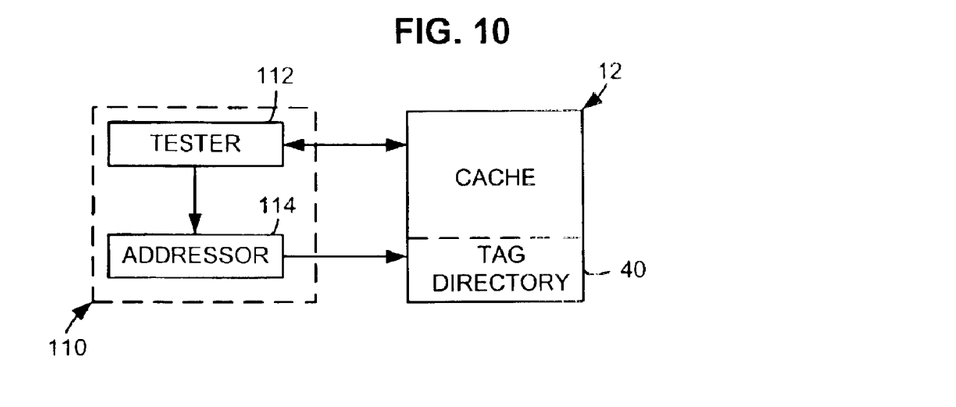
FIG. 10 is a schematic illustration of a programmable built-in self test apparatus for testing and programming a cache with a redundant array.

An example circuit for implementing the PBIST 110 is shown in FIG. 10. The illustrated PBIST 110 includes a tester 112 to test the cache 12 for defective array lines. The tester 112 is in communication with an addresser 114. The addresser 114 responds to the detection of a defective array line by writing redundancy data in the tag directory to map a redundant array line to the detected defective array line. The addresser 114 also writes validity data in the tag directory 40 to indicate that the redundancy data is valid. In the illustrated example, if the tester 112 detects two defective array lines on the same cache line, it identifies the cache 12 (and the corresponding microprocessor 10) as defective.

Figure 11:
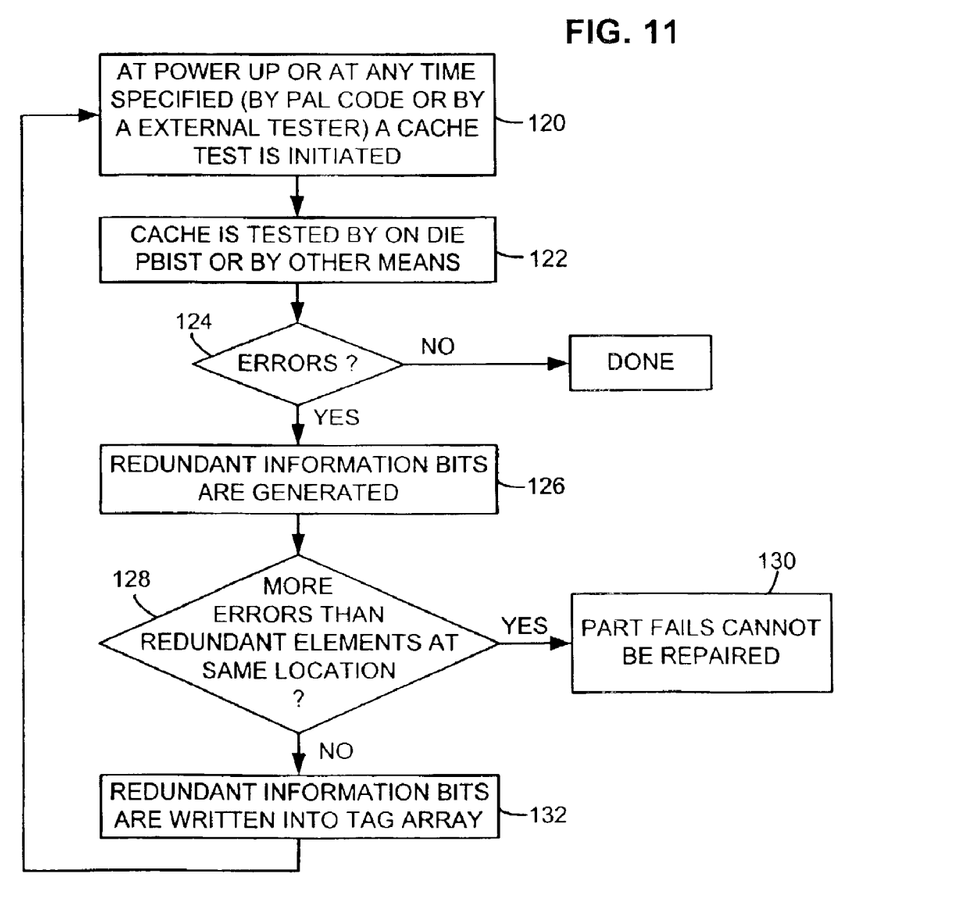
FIG. 11 is a flowchart illustrating an example computer program for implementing the apparatus of FIG. 9.

A flowchart of an example process for implementing the PBIST 110 is illustrated in FIG. 11. In this example, the process is embodied in the hardware of the PBIST 110, but persons of ordinary skill in the art will readily appreciate that the process could alternatively be embodied in a software program which is stored in a memory and executed by the CPU of the core 14 or an external CPU in a well known manner. Further, although the example process is described with reference to the flowchart illustrated in FIG. 11, a person of ordinary skill in the art will readily appreciate that many other methods of performing the acts associated with the PBIST 110 may alternatively be used. For example, the order of many of the blocks may be changed, and some of the blocks described may be omitted.

Turning to FIG. 11, the process begins when the cache test is initiated (block 120). As discussed above, the cache test can be initiated at any time (e.g., at power-up, at a user defined time, in the factory, etc.). The cache test can be initiated by an external tester (not shown) exciting the microprocessor 10 while the microprocessor 10 is mounted in a convention test jig in the factory. Alternatively, the cache test can be initiated by the processor abstraction layer (PAL) code in the BIOS of the microprocessor 10.

Once the test is initiated, the tester 112 (in the case of a PBIST 110 being used to test the chip) or an external tester is used to test each of the array lines for defects in a conventional manner (block 122). If no defective array lines are detected in the cache 12 (block 124), the process exits and the cache 12 is operable without employing the redundant array $R_0$.

If one or more defective array lines in the cache 12 are detected (block 124), the addresser 122 attempts to repair the cache 12. In particular, the addresser 122 generates the redundant data which maps array line(s) of the redundant array to the detected defective array line(s) (block 126). In the illustrated example, the redundant data is an address to be decoded into a logic high signal by the decoder 50 of the array including the defective array line when the corresponding cache line is addressed (i.e., read or written to).

If the tester 120 determines that there are more errored elements (e.g., more defective array lines) than redundant elements (e.g., redundant array lines) to replace those errored elements (block 128), the chip fails and is discarded as defective (block 130). Otherwise, the redundancy information is stored in the tag directory 40 as explained above (block 132) and the process exits.

During normal operation of the illustrated microprocessor 10, the redundancy information cannot be altered. To this end, in the illustrated example, only the PBIST 110 has "write" permission for the redundant and validity portions 44, 46 of the tag directory 40. The PBIST 110 of the illustrated device is turned off during normal operation to ensure the redundant and validity fields 44, 46 are in a read only condition.

From the foregoing, persons of ordinary skill in the art will appreciate that the illustrated device achieves enhanced redundancy without increasing the number of redundant elements. To illustrate this improvement, consider an 8 MB (megabyte), 8 Way, L3 cache with a cache line size of 128 bytes. (To simplify the calculation, ignore the ECC blocks.) The cache line is stored across thirty-two, 32 KB arrays. For every set of thirty-two, 32 KB arrays, there is one 32 KB redundancy array. There are 8196 cache lines in every Way of the cache. Thus, up to 8196 distinct errors (one in each cache line of a Way) can be corrected.

In the prior art, where one errored array was replaced by one redundant array in its entirety, errors in only one out of every thirty-two data arrays could be corrected through redundancy (again ignoring ECC). Thus, in this example, the illustrated device improves redundancy utilization by over 8000 times without actually increasing the amount of redundant elements. This greatly improves the manufacturing yield.

Persons of ordinary skill in the art will appreciate that there is no performance penalty associated with the enhanced redundancy technique of the illustrated examples. The avoidance of such a penalty is achieved because the reading and decoding of the redundancy data and the programming of the bus architecture 22 with the decoded information is not on the critical path (i.e., not on the bus itself).

Furthermore, the enhanced redundancy technique of the illustrated examples has only a small area impact. The increase in silicon area is due to inclusion of the PBIST 110 and the redundancy portions 44, 46 in the tag directory 40. Since most modern processors include a PBIST on the die to reduce test time, the area cost of the illustrated technique reduces to the redundancy structures 44, 46.

In the prior art approach (i.e., an entire memory array replaced by an entire redundant array), each line in the tag directory needed to store 30 bits of address data, 7 bits of ECC data, and 3 bits of state data for a total of 40 bits. In the illustrated device, 47 total bits are stored in the tag directory (i.e., 30 bits of address data, 8 bits of ECC data, 3 bits of state data plus 5 bits of redundancy data and 1 bit of validity data). In other words, the tag size grows by 18% (e.g., from 316 KB to 371 KB). The 1 additional ECC bit is added to correct the 5 redundancy bits and the 1 validity bit.

Lastly, although the above discussion has focused on read operations, persons of ordinary skill in the art will appreciate that write operations are analogously performed with the decoders 50 being used to dynamically program the bus architecture 22 to write data to the array lines identified by the redundancy data in the tag directory 40. To this end a second switching circuit is located in each array $A_0$–$A_N$, $R_0$. The second switching circuits are responsive to the outputs of the decoders 50 and the output of an adjacent switching circuit to disconnect from the adjacent buses, accept data from the bus to the right, or to accept data from the bus to the left in a manner analogous to the switching circuits 52 used for reading data out of the cache.

Figure 12:
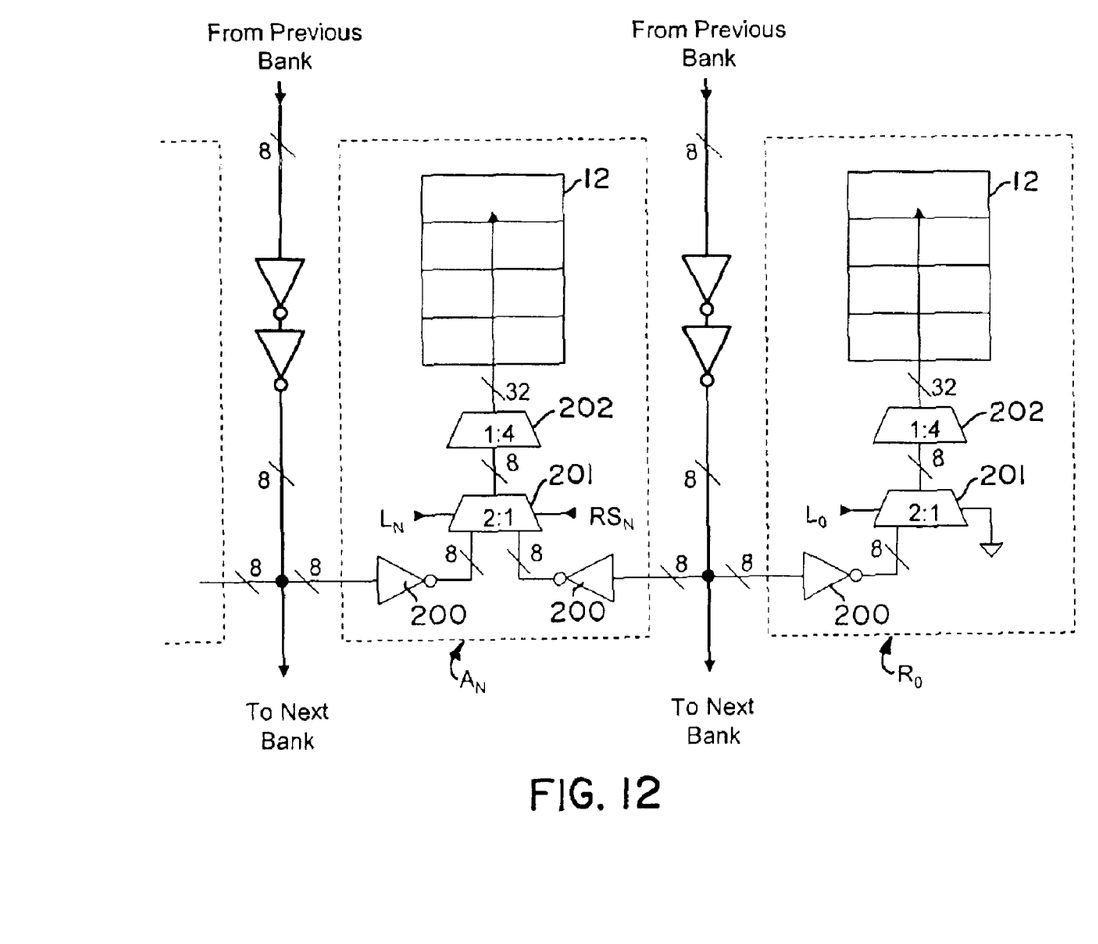
FIG. 12 is a schematic illustration of an example write logic circuit for the example arrays of FIGS. 7–9.

An example write logic circuit is shown in FIG. 12. As shown in that example, each of the arrays $A_1$–$A_N$ includes a set of inverters 200 for receiving input signals from the data bus to its left and a set of inverters 200 for receiving input signals from the data bus to its right. The outputs of both sets of inverters 200 are coupled to a 2:1 multiplexer 201. The multiplexer 201 receives two control signals, namely, a left shift signal $L_N$ and a right shift signal $RS_N$. The state of the left shift and right shift signals $L_N$, $RS_N$ are governed by the output of the decoders 50 and the output of an adjacent switching circuit precisely as explained above in connection with the example read logic circuits of FIGS. 7–9. Thus, when the left shift signal $L_N$ is logic high and the right shift signal $RS_N$ is logic low, the multiplexer 201 connects the data bus to the left of the array $A_1$–$A_N$ to the second multiplexer 202 via one set of the inverters 200. On the other hand, when the left shift signal $L_N$ is logic low and the right shift signal $RS_N$ is logic high, the multiplexer 201 connects the data bus to the right of the array $A_1$–$A_N$ to the second multiplexer 202 via the other set of inverters 200. The multiplexer 202 delivers the data it receives to the memory cells for recordation in a conventional manner.

As shown in FIG. 12, the write logic circuit of the redundant array is very similar to the write logic circuit of the other memory arrays $A_1$–$A_N$ except, since there is no data bus to the right of the redundant array $R_0$, the redundant array $R_0$ has only one set of inverters 200 and the right shift input of the multiplexer 201 is connected to ground. The first array $A_0$ is similar, but opposite to the redundant array $R_0$. Because the first array $A_0$ does not have a data bus to its left, it has only one set of input inverters 200 and its multiplexer 201 has its shift left input $L_0$ tied to ground.

As in the read context, when the cache is written to, the data in the tag directory is read out to dynamically program the bus architecture based on the health of the cache line to be written so that, if necessary, a defective array line can be skipped in the write operation just as that same defective cache line is skipped in the read operation.

Although certain apparatus constructed in accordance with the teachings of the invention have been described herein, the scope of coverage of this patent is not limited thereto. On the contrary, this patent covers all embodiments of the teachings of the invention fairly falling within the scope of the appended claims either literally or under the doctrine of equivalents.

What is claimed is:

1. For use with a microprocessor, an on-die cache comprising:
   a first memory array having a defective array line;
   a second memory array having a defective array line; and
   a redundant memory array having a plurality of array lines, a first one of the array lines being mapped to the defective array line of the first array and a second one of the array lines being mapped to the defective array line of the second array.

2. An on-die cache as defined in claim 1, wherein the defective array lines of the first and second arrays are on different cache lines.

3. An on-die cache as defined in claim 1, further comprising a tag directory to selectively map main memory addresses to cache lines, the tag directory being structured to selectively store redundancy data to map the first array line to the defective array line of the first array and the second array line to the defective array line of the second array.

4. An on-die cache as defined in claim 3, further comprising a first decoder to decode the redundancy data when a cache line associated with the first array line is accessed.

5. An on-die cache as defined in claim 4, further comprising a first bus, a second bus, and a first switching circuit associated with the first array line and responsive to a first output of the first decoder to disconnect the first array line from the first and second buses.

6. An on-die cache as defined in claim 5, further comprising a third bus, a fourth bus, a second decoder and a second switching circuit associated with the second array, the second decoder to decode the redundancy data when the cache line associated with the first array line is read, the second switching circuit being responsive to the first output of the first decoder and a first output of the second decoder to connect a third array line of the second array to the third bus.

7. An on-die cache as defined in claim 6, wherein the first switching circuit is responsive to a second output of the first decoder and an input signal to selectively connect the first array line to one of the first and second buses.

8. An on-die cache as defined in claim 7, wherein the second switching circuit is responsive to the second output of the first decoder and the first output of the second decoder to connect the third array line to the fourth bus.

9. An on-die cache as defined in claim 6, wherein the third bus is the second bus.

10. An on-die cache as defined in claim 6, wherein the second switching circuit is responsive to a second output of the second decoder to disconnect the third array line from the third and fourth data buses.

11. An on-die cache as defined in claim 6, wherein the second switching circuit is responsive to the first output of the second decoder to connect the second array line to one of the third and fourth buses.

12. An on-die cache as defined in claim 6, further comprising a main bus, the first, second, third and fourth buses being in communication with the main bus to deliver stored data from the cache line to the main bus.

13. An on-die cache as defined in claim 3, wherein the redundancy data includes validity data indicative of validity of data in the redundancy array.

14. An on-die cache comprising:
   a first array;
   a second array; and
   a redundant array to replace a first defective portion of the first array and a second defective portion:of the second array.

15. An on-die cache as defined in claim 14, wherein the defective portions of the first and second arrays are on different cache lines.

16. An on-die cache as defined in claim 14, further comprising a tag directory to selectively map main memory addresses to cache lines, the tag directory being structured to selectively store redundancy data to map the redundant array to the first and second defective portions.

17. An on-die cache as defined in claim 14 further comprising a dynamically programmable bus architecture.

18. An on-die cache as defined in claim 17 wherein a first subset of the first array, the second array and the redundant array is coupled to the bus architecture when a first cache line is accessed and a second subset of the first array, the second array and the redundant array is coupled to the bus architecture when a second cache line is accessed.

19. An on-die cache as defined in claim 17 wherein the bus architecture has a first configuration when a first cache line is accessed and a second configuration when a second cache line is accessed.

20. A method of repairing an on-die cache having a first array, a second array and a redundant array comprising:
    detecting a defective array line of the first array;
    mapping a first array line of the redundant array to the defective array line of the first array;
    detecting a defective line of the second array; and
    mapping a second array line of the redundant array to the defective array line of the second array.

21. A method as defined in claim 20 wherein mapping the first array line comprises recording redundancy data in association with the first array line.

22. A method as defined in claim 21 wherein mapping the first array line further comprises recording validity data in association with the first array line.

23. A method as defined in claim 21 wherein mapping the second array line comprises recording redundancy data in association with the second array line.

24. A method as defined in claim 23 wherein mapping the second array line further comprises recording validity data in association with the second array line.

25. A method as defined in claim 21, further comprising decoding the redundancy data when a cache line associated with the first array line is at least one of read and written to.

26. A method as defined in claim 25, further comprising disconnecting the first array line from a main bus in response to the decoding of the redundancy data.

27. A method as defined in claim 26, further comprising connecting the second array to one of a first bus and a second bus in response to the decoding of the redundancy data.

28. A method as defined in claim 26, further comprising selectively connecting the redundant array to the main bus.

29. A method as defined in claim 20, wherein the defective array lines of the first and second arrays are on different cache lines.

30. A method of operating an on-die cache comprising:
    performing a test of the on-die cache to detect defective lines in a plurality of memory arrays;
    storing redundancy data mapping lines of a redundant array to the detected defective lines of the memory arrays; and
    dynamically programming a bus architecture associated with the plurality of memory arrays based on the redundancy data.

31. A method as defined in claim 30, wherein dynamically programming the bus architecture further comprises:
    coupling a first subset of the memory arrays and the redundant array to the bus architecture in response to a request to access a first cache line; and
    coupling a second subset of the memory arrays and the redundant array to the bus architecture in response to a request to access a second cache line.

32. A self-healing microprocessor comprising:
    a core;
    a cache having a plurality of memory arrays in a bank;
    a main bus coupling the core and the cache; and
    a dynamically programmable bus architecture to selectively couple subsets of the memory arrays in the bank to the main bus.

33. A microprocessor as defined in claim 32, further comprising a self-test circuit to test the cache for defects in the memory arrays and to develop and store redundancy data in response to the test, the redundancy data being used to dynamically program the bus architecture.

34. A microprocessor as defined in claim 33, wherein the self-test circuit operates periodically.

35. A microprocessor as defined in claim 33, wherein the self-test circuit operates at boot-up.

36. A microprocessor as defined in claim 32, wherein the bus architecture has a first configuration when a first cache line is accessed and a second configuration when a second cache line is accessed.

37. A microprocessor as defined in claim 32, wherein the plurality of memory arrays includes redundant arrays, each of the redundant arrays being assigned to a bank of the memory arrays, and each of the redundant arrays having a plurality of array lines.

38. A microprocessor as defined in claim 37, wherein a first one of the redundant arrays has a first array line mapped to a defective array line of a first array and a second array line mapped to a defective array line of a second array.

39. A microprocessor as defined in claim 38, wherein the defective array lines of the first and second arrays are located on different cache lines.

40. A self-repairing cache comprising:
    a redundant array;
    a plurality of memory arrays associated with the redundant array; and
    a dynamically programmable bus architecture adapted to have a first configuration when a cache line with a defective line in one of the plurality of arrays is accessed and a second configuration when a cache line without a defective line is accessed.

41. A self-repairing cache as defined in claim 40, further comprising a self-test circuit to test the memory arrays for defects and to develop and store redundancy data in response to the test, the redundancy data being adapted to dynamically program the bus architecture.

42. A self-repairing cache as defined in claim 41, wherein the self-test circuit operates periodically.

43. A self-repairing cache as defined in claim 41, wherein the self-test circuit operates at boot-up.

44. A self-repairing cache as defined in claim 40, wherein the redundant array has a first array line mapped to a defective array line of a first one of the memory arrays and a second array line mapped to a defective array line of a second one of the memory arrays.

45. A self-repairing cache as defined in claim 44, wherein the defective lines of the first and second arrays are located on different cache lines.

46. A method of manufacturing a microprocessor comprising:
    fabricating a microprocessor;
    activating a built-in self-test circuit to test an on-die cache for defects;

programming a programmable bus architecture to have a first configuration when a first cache line having a first defect is accessed; and programming the programmable bus architecture to have a second configuration when a second cache line is accessed.

47. A method as defined in claim 46 wherein the on-die cache comprises a plurality of memory arrays, the programmable bus architecture includes a plurality of buses, and programming the programmable bus architecture to have a first configuration comprises assigning a first subset of the memory arrays to the buses.

48. A method as defined in claim 47 wherein programming the programmable bus architecture to have a second configuration comprises assigning a second subset of the memory arrays to the buses.

49. A method of booting a microprocessor comprising:

initiating a boot-up sequence;

activating a built-in self-test circuit to test an on-die cache for defects;

programming a programmable bus architecture to have a first configuration when a first cache line having a first defect is read; and programming the programmable bus architecture to have a second configuration when a second cache line is read.

50. A method as defined in claim 49 wherein the on-die cache comprises a plurality of memory arrays, the programmable bus architecture includes a plurality of buses, and programming the programmable bus architecture to have a first configuration comprises assigning a first subset of the memory arrays to the buses.

51. A method as defined in claim 50 wherein programming the programmable bus architecture to have a second configuration comprises assigning a second subset of the memory arrays to the buses.

52. For use with a cache, a tag directory comprising:

a first memory structure associated with a first cache line to store address information associated with data stored in the first cache line; and a second memory structure associated with the first memory structure to store redundancy data identifying a defective array line in a memory array in the first cache line.

53. A tag directory as defined in claim 52 further comprising a third memory structure associated with the second memory structure to store validity data indicating if the redundancy data stored in the second memory structure is valid.

54. A programmable built-in self-test circuit located on a microprocessor, the self-test circuit comprising:

a tester to test for defective array lines in a cache; and an addresser to write redundancy data in a tag directory to map a first redundant array line to a first defective array line.

55. A self-test circuit as defined in claim 54 wherein the addresser is adapted to write validity data in the tag directory to indicate associated redundancy data is valid.

56. A self-test circuit as defined in claim 54 wherein the tester identifies the cache as defective if at least two defective array lines are located on one cache line.

57. A self-test circuit as defined in claim 54 wherein the self-test circuit is activated periodically.

58. A self-test circuit as defined in claim 54 wherein the self-test circuit is activated at boot-up of the microprocessor.

59. A self-test circuit as defined in claim 54 wherein the redundancy data maps a second redundant array line to a second defective array line, the first and second redundant array lines being located in one redundant array.

* * * * *